(12) United States Patent
Ichige et al.

(10) Patent No.: US 7,442,985 B2
(45) Date of Patent: *Oct. 28, 2008

(54) SEMICONDUCTOR MEMORY DEVICE HAVING MEMORY CELL SECTION AND PERIPHERAL CIRCUIT SECTION AND METHOD OF MANUFACTURING THE SAME

(75) Inventors: Masayuki Ichige, Yokohama (JP); Riichiro Shirota, Fujisawa (JP); Yuji Takeuchi, Yokohama (JP); Kikuko Sugimae, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 9 days.

This patent is subject to a terminal disclaimer.

(21) Appl. No.: 11/283,742

(22) Filed: Nov. 22, 2005

(65) Prior Publication Data

US 2006/0071293 A1   Apr. 6, 2006

Related U.S. Application Data

(62) Division of application No. 10/455,427, filed on Jun. 6, 2003, now Pat. No. 6,995,425, which is a division of application No. 09/916,595, filed on Jul. 30, 2001, now Pat. No. 6,590,255.

(30) Foreign Application Priority Data

Sep. 29, 2000 (JP) ............................. 2000-301309
Sep. 29, 2000 (JP) ............................. 2000-301380

(51) Int. Cl.
*H01L 29/788* (2006.01)

(52) U.S. Cl. .................. 257/315; 257/316; 257/319; 257/397; 257/E27.103

(58) Field of Classification Search ................. 257/315, 257/316, 319, 395–397, 506, E27.102, E27.103, 257/E29.3
See application file for complete search history.

(56) References Cited

U.S. PATENT DOCUMENTS 5,208,179 A   5/1993   Okazawa (Continued)

FOREIGN PATENT DOCUMENTS

JP   3-112164   5/1991

(Continued)

OTHER PUBLICATIONS

U.S. Appl. No. 11/283,742, filed Nov. 22, 2005, Ichige et al.

*Primary Examiner*—Matthew E Warren
(74) *Attorney, Agent, or Firm*—Oblon, Spivak, McClelland, Maier & Neustadt, P.C.

(57) ABSTRACT

An element isolating region for separating an element region of a semiconductor layer is formed in a peripheral circuit section of a semiconductor memory device, and a first conductive layer is formed with the element region with a first insulating film interposed therebetween. A second conductive layer is formed on the first conductive layer to extend into the element isolating region. A surface of that section of the second conductive layer which is positioned within the element isolating region is exposed, and a third conductive layer is formed on the second conductive layer with a second insulating film interposed therebetween. Further, a contact is electrically connected to an exposed surface of the second conductive layer.

4 Claims, 14 Drawing Sheets

U.S. PATENT DOCUMENTS

| | | |
|---|---|---|
| 5,622,881 A | 4/1997 | Acocelia et al. |
| 5,635,416 A | 6/1997 | Chen et al. |
| 6,034,393 A | 3/2000 | Sakamoto et al. |
| 6,091,129 A | 7/2000 | Cleeves |
| 6,340,611 B1 | 1/2002 | Shimizu et al. |
| 6,376,304 B1 | 4/2002 | Matsuoka et al. |
| 6,590,255 B2 * | 7/2003 | Ichige et al. ............. 257/315 |
| 6,667,507 B2 | 12/2003 | Shirota et al. |
| 6,921,960 B2 | 7/2005 | Ichige et al. |
| 6,995,425 B2 * | 2/2006 | Ichige et al. ............. 257/326 |

FOREIGN PATENT DOCUMENTS

| | | |
|---|---|---|
| JP | 9-213911 | 8/1997 |
| JP | 11-3982 | 1/1999 |
| JP | 11-26731 | 1/1999 |
| JP | 11026731 A | 1/1999 |
| JP | 11-251318 | 9/1999 |
| JP | 2000-150834 | 5/2000 |

* cited by examiner

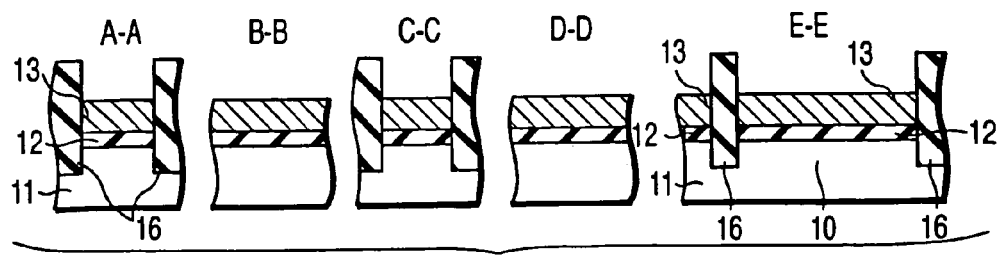
F I G. 4A
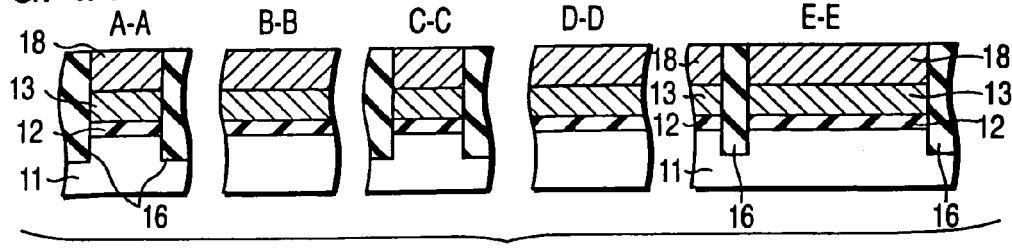
F I G. 4B
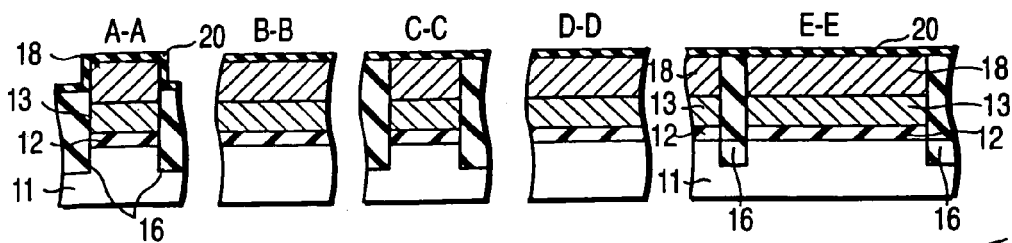
F I G. 4C
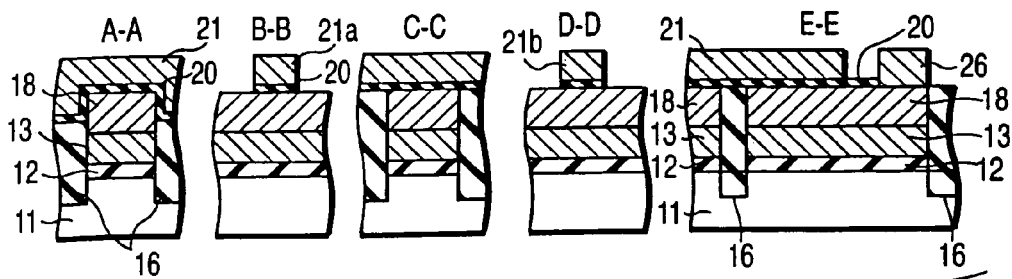
F I G. 4D
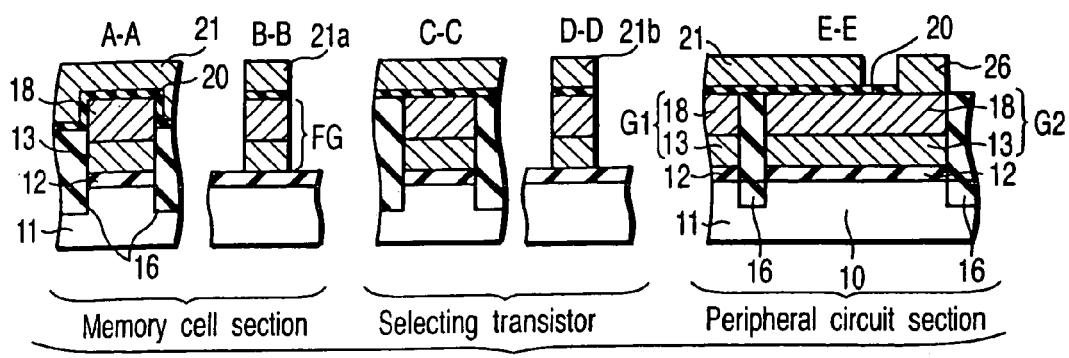
F I G. 4E

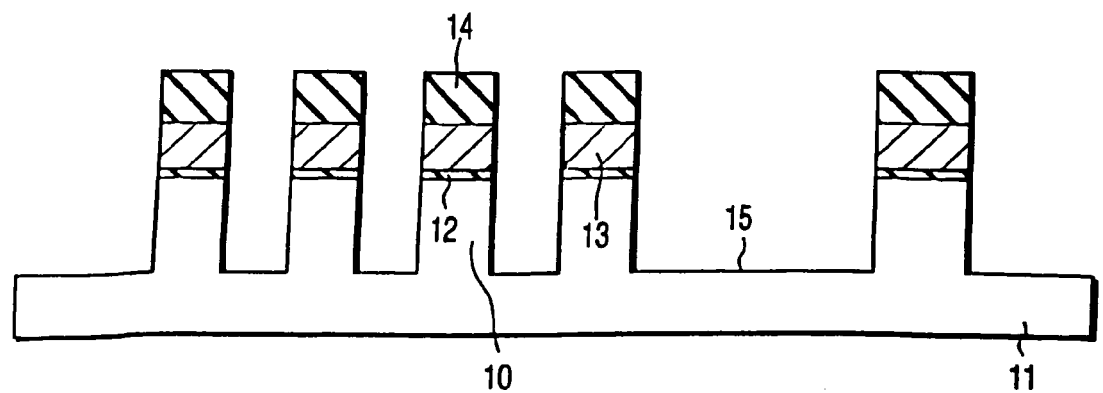
F I G. 7
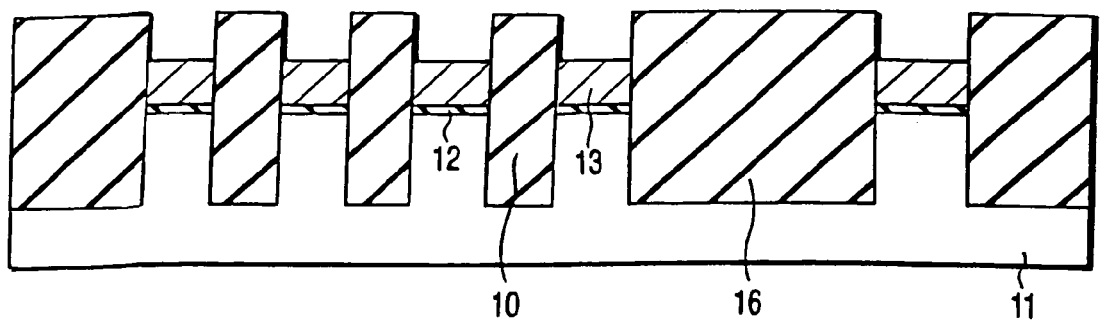
F I G. 8
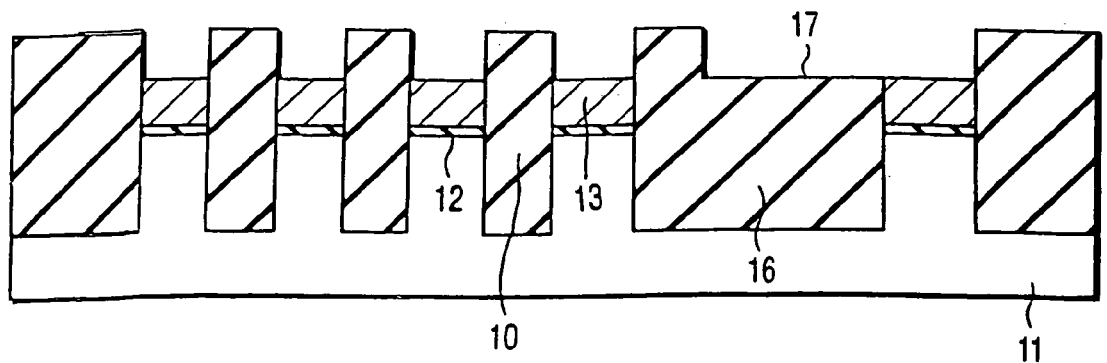
F I G. 9

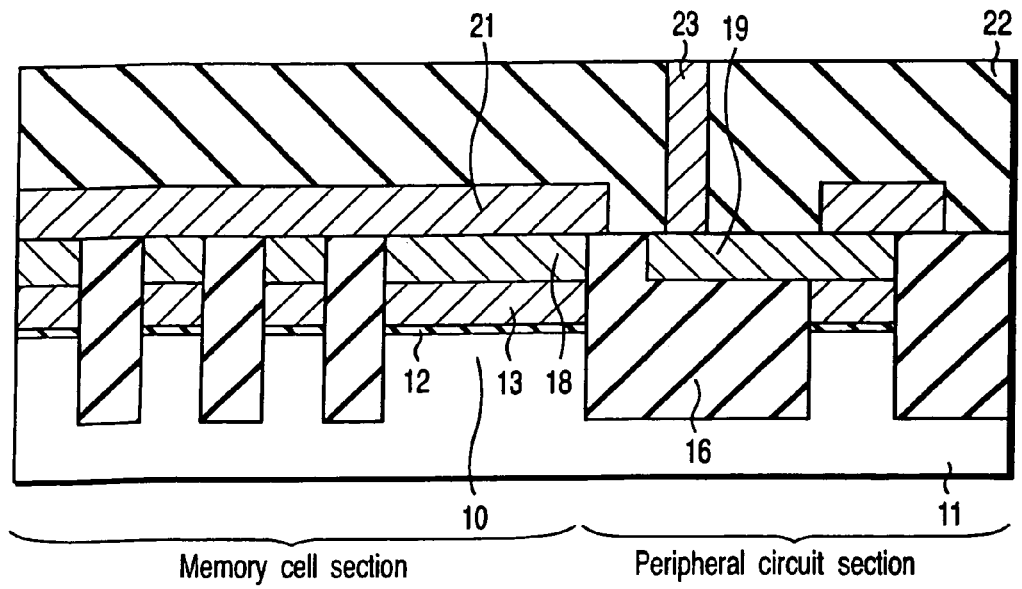
F I G. 12
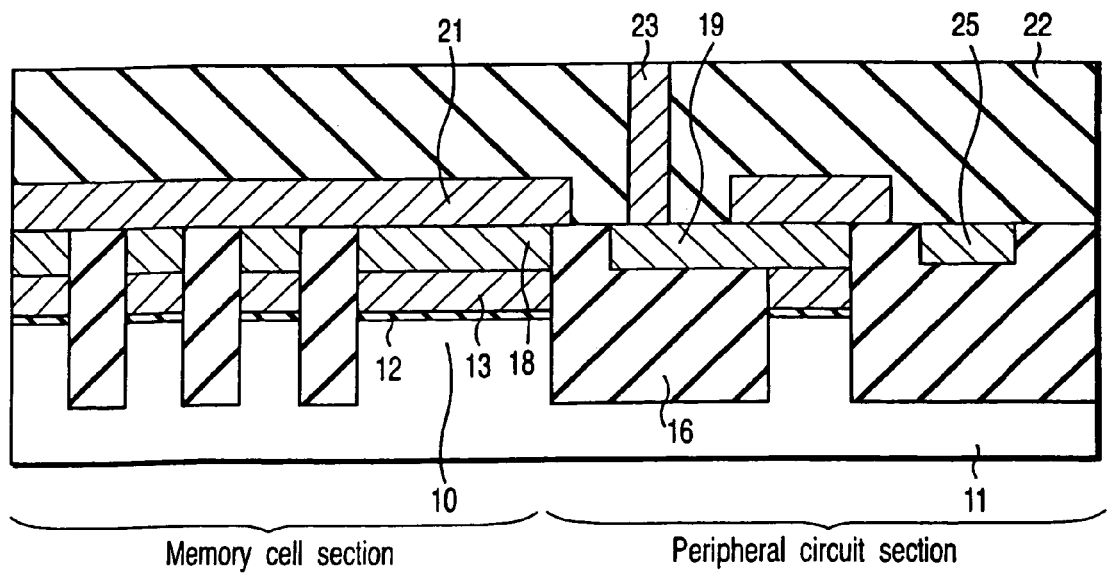
F I G. 13

SEMICONDUCTOR MEMORY DEVICE HAVING MEMORY CELL SECTION AND PERIPHERAL CIRCUIT SECTION AND METHOD OF MANUFACTURING THE SAME

CROSS-REFERENCE TO RELATED APPLICATIONS

This application is a divisional of U.S. application Ser. No. 10/455,427 filed Jun. 6, 2003, which is a divisional of U.S. application Ser. No. 09/916,595 filed Jul. 30, 2001, and is based upon and claims the benefit of priority from the prior Japanese Patent Applications No. 2000-301309, filed Sep. 29, 2000; and No. 2000-301380, filed Sep. 29, 2000, the entire contents of each of which are incorporated herein by reference.

BACKGROUND OF THE INVENTION

1. Field of the Invention

The present invention relates to a semiconductor memory device and a method of manufacturing the same, particularly, to a nonvolatile semiconductor memory device having a memory cell section and a peripheral circuit section and a method of manufacturing the same.

2. Description of the Related Art

In general, a flash memory, which is a nonvolatile memory, includes a memory cell section and a peripheral circuit section arranged around the memory section. The memory cell section includes a cell transistor constituting a memory cell. The cell transistor is of a laminated gate structure including a floating gate and a control gate. On the other hand, the peripheral circuit section includes various delay circuits required for the control of the memory cell section and a high voltage stabilizing circuit for the writing/erasing of information. It follows that a cell transistor constituting the memory cell and a transistor constituting the peripheral circuit are formed within the chip.

In recent years, the manufacturing technology of the semiconductor device has achieved a drastic progress, and the element is being miniaturized rapidly. Also, in order to reduce the manufacturing cost, serious demands are being directed to the improvement in the efficiency of the manufacturing process. Under the circumstances, it is intended to improve the efficiency of the manufacturing process by manufacturing the flash memory by using a manufacturing process substantially equal to that for manufacturing the cell transistor and the transistor in the peripheral circuit. Since the peripheral circuit of the flash memory is manufactured by the manufacturing process substantially equal to that for manufacturing a memory cell array of the laminated gate structure, the transistor of the peripheral circuit also has a laminated gate structure.

FIG. 21A is a plan view showing a transistor constituting the peripheral circuit of the conventional flash memory, and FIG. 21B is a cross sectional view along the line XXIB-XXIB shown in FIG. 21A.

As shown in FIG. 21B, an element isolating region 16 of an STI (Shallow Trench Isolation) structure for separating an element region 10 is formed in a semiconductor substrate 11. Then, a gate insulating film 12 is formed on the surface of the semiconductor substrate 11. A first conductive layer 13 is deposited on the gate insulating film 12, and a second conductive layer 18 is deposited on the first conductive layer 13. An insulating film 20 is deposited on the second conductive layer 18, and a third conductive layer 21 is deposited on the insulating layer 20. Then, the first and second conductive layers 13 and 18 are selectively removed so as to form a gate electrode G of a laminated gate structure. Further, the third conductive layer 21 and the insulating film 20 are selectively removed, followed by depositing an insulating film 22 on the entire surface and subsequently removing selectively the insulating film 20. As a result, formed is a contact hole exposing a part of the surface of the second conductive layer 18. The contact hole thus formed is filled with a conductive layer so as to form a contact 23 connected to the second conductive layer 18.

In the conventional a thin gate described above, a mask deviation caused by the shortening of lithography step, required is a fringe (allowance) on the element isolating region 16 of the opposite gate. As a result, each of the edge portions of the gate electrode G in the width direction of the gate electrode G is rendered larger by a distance B than the width of the element region 10, as shown in FIG. 21A. Since the distance between the elements is increased by at least twice the distance B noted above, i.e., B×2, it was difficult to diminish the chip area so that it was difficult to diminish the peripheral circuit section.

As described above, in the conventional flash memory, it was difficult to manufacture simultaneously the memory cell section and the peripheral circuit section by using substantially the same process while diminishing the chip area.

BRIEF SUMMARY OF THE INVENTION

According to a first aspect of the present invention, there is provided a semiconductor memory device, comprising a semiconductor layer including an element region and an element isolating region for separating the element region; a first conductive layer formed within the element region with a first insulating film interposed therebetween; a second conductive layer formed on the first conductive layer within the element region; a second insulating film formed on the second conductive layer, the second insulating film partly exposing a surface of the second conductive layer; a third conductive layer formed on the second insulating film; a fourth conductive layer formed on an exposed surface of the second conductive layer, the fourth conductive layer being electrically insulated from the third conductive layer; and a contact region electrically connected to the fourth conductive layer.

According to a second aspect of the present invention, there is provided a semiconductor memory device, comprising a semiconductor layer including an element region and an element isolating region for separating the element region; a first conductive layer formed within the element region with a first insulating film interposed therebetween; a second conductive layer formed on the first conductive layer within the element region, the second conductive layer formed on the first conductive layer extending into the element isolating region, and the second conductive layer including a first section formed on the first conductive layer and a second section formed within the element isolating region; a third conductive layer formed on the second conductive layer with a second insulating film interposed therebetween, the third conductive layer and the second insulating film exposing at least one part of a surface of the second section; and a contact region electrically connected to an exposed surface of the second section.

According to a third aspect of the present invention, there is provided a semiconductor memory device, comprising a semiconductor layer including an element region and an element isolating region for separating the element region; a first conductive layer formed within the element region with an insulating film interposed therebetween; a second conductive layer formed on the first conductive layer within the element region, the second conductive layer formed on the first conductive layer extending into the element isolating region, and the second conductive layer including a first section formed on the first conductive layer and a second section formed within the element isolating region; a third conductive layer formed on the second conductive layer and exposing at least one part of a surface of the second section; and a contact region electrically connected to an exposed surface of the second section.

According to a fourth aspect of the present invention, there is provided a semiconductor memory device, comprising a semiconductor layer including an element region and an element isolating region for separating the element region; a first conductive layer formed within the element region with an insulating film interposed therebetween, the first conductive layer, which is formed on the insulating layer, extending into the element isolating region and including a first section formed on the insulating film and a second section formed within the element isolating region; a second conductive layer formed on the first conductive layer and exposing at least one part of a surface of the second section; and a contact region electrically connected to an exposed surface of the second section.

According to a fifth aspect of the present invention, there is provided a method of manufacturing a semiconductor memory device comprised of a memory cell section including first and second conductive layers composing a floating gate, and a third conductive layer composing a control gate, and a peripheral circuit section arranged around the memory cell section, comprising forming a first conductive layer on a semiconductor layer including an element region with a first insulating film interposed therebetween; forming a mask layer on the first conductive layer; selectively removing the mask layer, the first conductive layer, the first insulating film, and the semiconductor layer to form an element isolating groove; forming an element isolating insulating film within the element isolating groove to form an element isolating region; removing the mask layer; forming a second conductive layer on the first conductive layer and the element isolating region; removing the second conductive layer until at least a surface of the element isolating region is exposed; forming a third conductive layer on the second conductive layer and the element isolating region with a second insulating film interposed therebetween; selectively removing the third conductive layer; selectively removing the second insulating film to expose one part of a surface of the second conductive layer of the peripheral circuit section; forming a fourth conductive layer on an exposed surface of the second conductive layer; and forming a contact region electrically connected to the fourth conductive layer.

According to a sixth aspect of the present invention, there is provided a method of manufacturing a semiconductor memory device comprised of a memory cell section including first and second conductive layers composing a floating gate, and a third conductive layer composing a control gate, and a peripheral circuit section arranged around the memory cell section, comprising forming a first conductive layer on a semiconductor layer including an element region with a first insulating film interposed therebetween; forming a mask layer on the first conductive layer; selectively removing the mask layer, the first conductive layer, the first insulating film, and the semiconductor layer to form an element isolating groove; forming an element isolating insulating film within the element isolating groove to form an element isolating region; removing the mask layer; removing a part of the element isolating region in contact with the element region of the peripheral circuit section to form a groove in the element isolating region; forming a second conductive layer on the first conductive layer and the element isolating region; removing the second conductive layer until at least a surface of the element isolating region is exposed to form an extending section comprising of the second conductive layer within the groove; forming a third conductive layer on the second conductive layer and the element isolating region with a second insulating film interposed therebetween; selectively removing the third conductive layer and the second insulating film to expose a part of a surface of the extending section; and forming a contact region electrically connected to an exposed surface of the extending section.

Further, according to a seventh aspect of the present invention, there is provided a method of manufacturing a semiconductor memory device comprised of a memory cell section including a first conductive layer composing a floating gate, and a second conductive layer composing a control gate, and a peripheral circuit section arranged around the memory cell section, comprising forming a dummy insulating film on a semiconductor layer including an element region; forming a mask layer on the dummy insulating film; selectively removing the mask layer, the dummy insulating film, and the semiconductor layer to form an element isolating groove; forming an insulating film for the element isolation in the element isolating groove to form an element isolating region; selectively removing the element isolating region in contact with the element region of the peripheral circuit section to form a groove in the element isolating region; removing the mask layer and the dummy insulating film; forming a gate insulating film on the semiconductor layer; forming a first conductive layer on the gate insulating film and the element isolating region; removing the first conductive layer until at least a surface of the element isolating region is exposed to form an extending portion comprising of the first conductive layer within the groove; forming a second conductive layer on the first conductive layer and the element isolating region; selectively removing the second conductive layer to expose a part of a surface of the extending section; and forming a contact region electrically connected to an exposed surface of the extending section.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 4A, 4B, 4C, 4D and 4E are cross sectional views collectively showing the manufacturing process, after the step shown in FIG. 2C, of the semiconductor memory device according to the first embodiment of the present invention;

FIGS. 7, 8, 9, 10 and 11 are cross sectional views collectively showing the manufacturing process of a semiconductor memory device according to the third embodiment of the present invention;

FIG. 12 is a cross sectional view showing the memory cell section and the peripheral circuit section of a semiconductor memory device according to a fourth embodiment of the present invention;

FIG. 13 is a cross sectional view showing another semiconductor memory device according to the fourth embodiment of the present invention;

DETAILED DESCRIPTION OF THE INVENTION

The nonvolatile semiconductor memory device of the present invention comprises a memory cell section and a peripheral circuit section arranged around the memory section. The memory section includes a cell transistor constituting a memory cell, and the cell transistor is of a laminated gate structure having a floating gate and a control gate. On the other hand, the peripheral circuit section includes various delay circuits required for controlling the memory cell section and a high voltage stabilizing circuit for writing/erasing information. It follows that a cell transistor constituting a memory cell and a transistor constituting a peripheral circuit are formed within the chip.

Some embodiments of the present invention will now be described with reference to the accompanying drawings.

First Embodiment

The semiconductor memory device according to the first embodiment of the present invention is featured in that the gate electrode of a transistor included in the peripheral circuit section is formed by self-alignment with an element isolating region, and the distance between the adjacent gate electrodes of the transistors is equal to the width of the element isolating region.

Figure 1A:
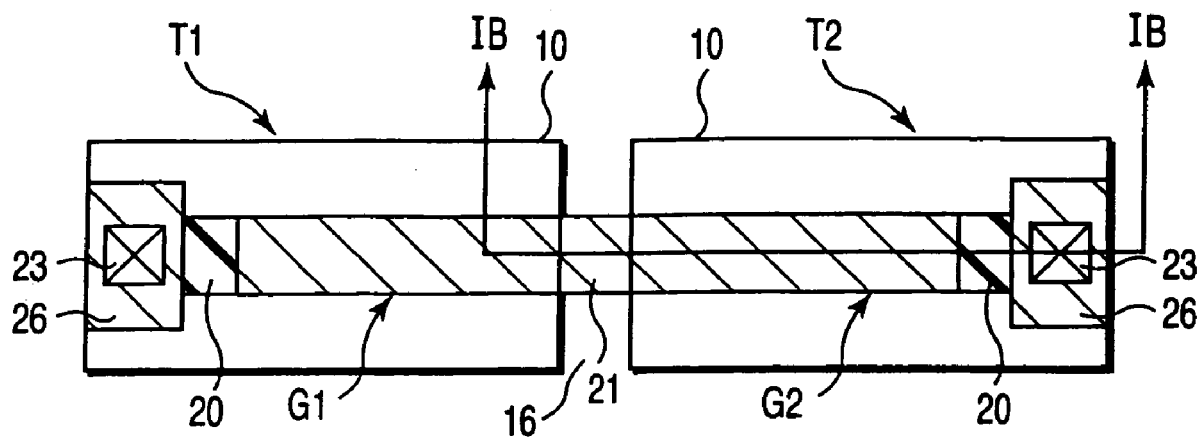
FIG. 1A is a plan view showing a transistor of a peripheral circuit section according to a first embodiment of the present invention.
Figure 1B:
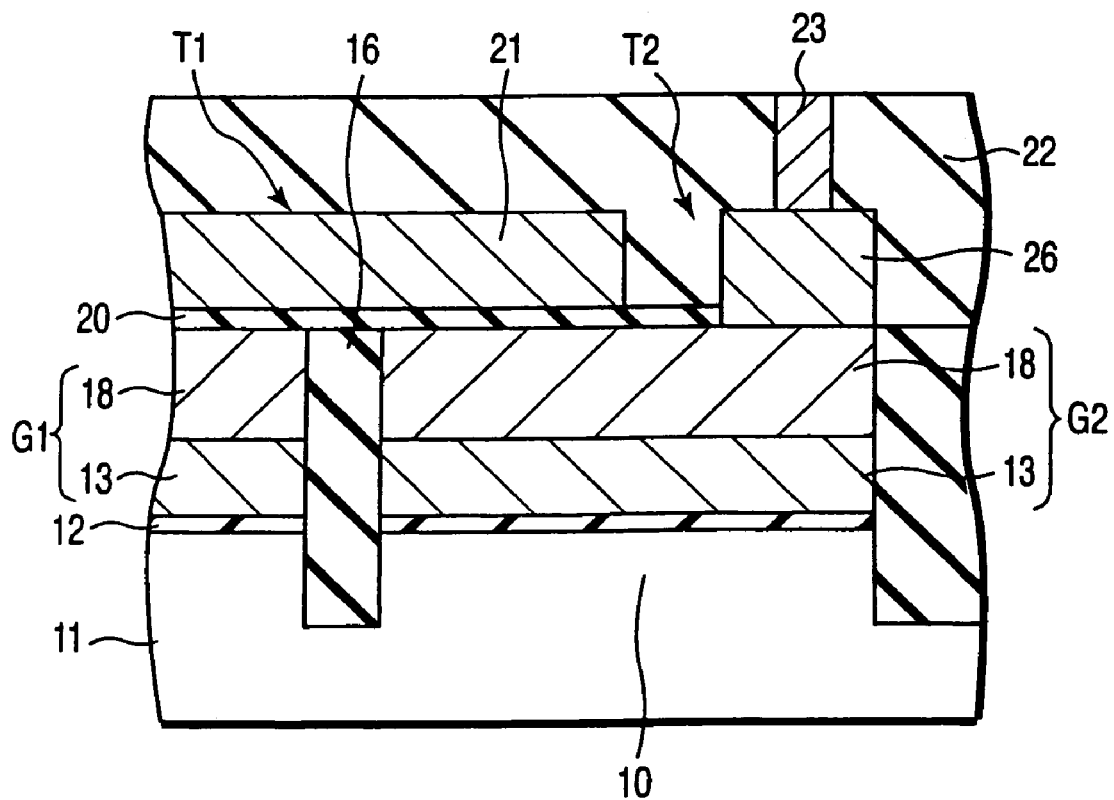
FIG. 1B is a cross sectional view of the transistor along the line IB-IB shown in FIG. 1A.

FIG. 1A is a plan view showing a transistor of the peripheral circuit section according to the first embodiment of the present invention, and FIG. 1B is a cross sectional view of the transistor along the line IB-IB shown in FIG. 1A.

As shown in FIG. 1A, the gate width of each of gate electrodes G1 and G2 included in the peripheral circuit section is equal to the width of an element region 10. In other words, the distance between the adjacent gate electrodes G1 and G2 is equal to the width of an element isolating region 16. Also, a third conductive layer 21 formed on the gate electrodes G1 and G2 is formed over the adjacent transistors T1 and T2 because the third conductive layer 21 is electrically insulated from the gate electrodes G1 and G2.

To be more specific, the element isolating region 16 for separating an element region (active region) 10 of a semiconductor layer 11 is formed in the semiconductor memory device in the peripheral circuit section, and a first conductive layer 13 is formed above the element region 10 with a first insulating film 12 interposed therebetween as shown in FIG. 1B. A second conductive layer 18 is formed on the first conductive layer 13. The surface of the second conductive layer 18 is flush with or lower than the surface of the element isolating region 16. A second insulating film 20 is formed on the second conductive layer 18 such that the surface of the second conductive layer 18 is partly exposed to the outside. A third conductive layer 21 is selectively formed on the second insulating film 20. Then, a fourth conductive layer 26 is formed on the exposed surface of the second conductive layer 18 such that the fourth conductive layer 26 is not electrically connected to the third conductive layer 21. Further, a contact 23 is electrically connected to the fourth conductive layer 26.

As described above, each of the gate electrodes G1 and G2 of the transistors T1 and T2, respectively, is formed of the first and second conductive layers 13 and 18 so as to form a laminated gate structure. It should be noted that the third conductive layer 21 is electrically insulated from the gate electrodes G1 and G2 by the second insulating film 20 and, thus, does not perform the function of the gate electrodes of the transistors T1 and T2.

FIGS. 2A to 2C, 3A to 3E and 4A to 4E schematically show collectively the manufacturing process the transistors for the memory cell section and the peripheral circuit section of the semiconductor memory device according to the first embodiment of the present invention. It should be noted that the marks A-A, B-B, C-C, D-D and E-E shown in FIGS. 4A to 4E represent the cross sectional views along the lines A-A, B-B, C-C, D-D and E-E of the plan views shown in FIGS. 3A to 3E, respectively.

The manufacturing method of the transistors included in the memory cell section and the peripheral circuit section of the semiconductor memory device according to the first embodiment of the present invention will now be described with reference to FIGS. 2A to 2C, 3A to 3E and 4A to 4E. In the following description, a NAND type EEPROM is exemplified as a semiconductor memory device.

Figure 2A:
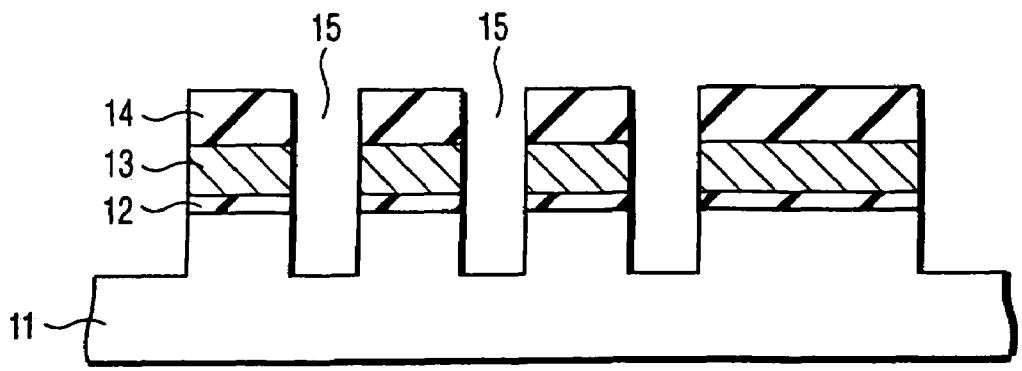
FIGS. 2A, 2B and 2C are cross sectional views collectively showing the manufacturing process of a semiconductor memory device according to the first embodiment of the present invention.

In the first step, the first insulating film 12 is formed on the semiconductor layer 11, as shown in FIG. 2A. The first insulating film 12 in the memory cell section and the peripheral circuit section is formed of, for example, silicon oxide or oxynitride. Then, a first conductive layer 13 consisting of, for example, a polycrystalline silicon (polysilicon) is formed on the first insulating film 12, followed by forming a mask layer 14 on the first conductive layer 13. Then, the first conductive layer 13, the first insulating film 12 and the semiconductor layer 11 are selectively etched with the mask layer 14 used as a mask so as to form the element isolating groove 15 for the element isolation region.

Figure 2B:
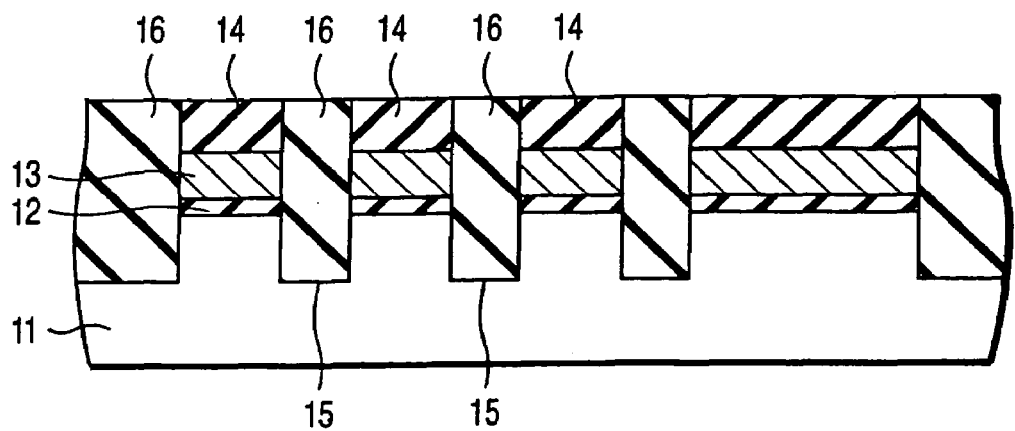

In the next step, an insulating film for the element isolation is formed in a manner to fill the element isolating groove 15, as shown in FIG. 2B. Then, the insulating film for the element isolation is planarized by a CMP (Chemical Mechanical Polishing) method with the mask layer 14 used as a stopper. As a result, the element isolating region 16 of an STI (Shallow Trench Isolation) structure is formed within the element isolating groove 15.

Figure 2C:
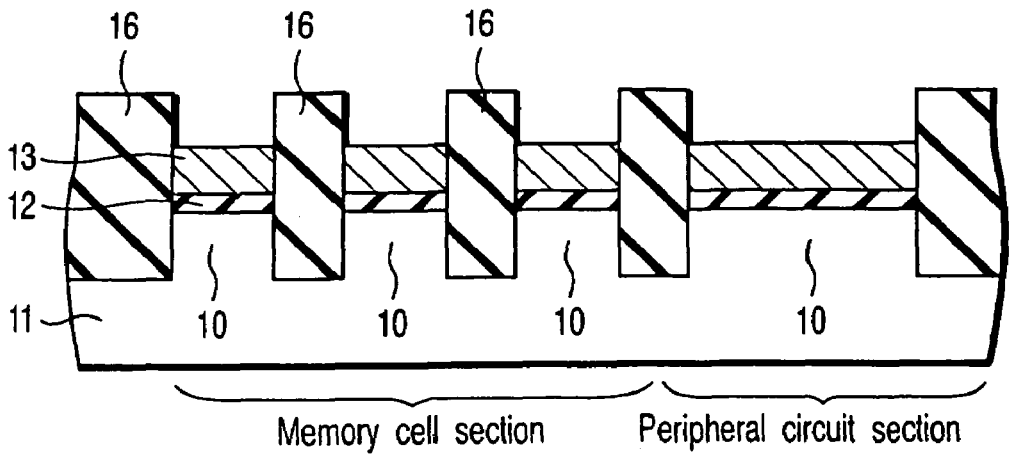
Figure 3A:
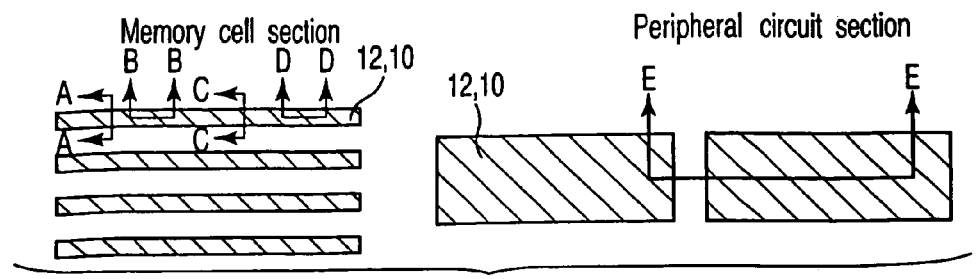
FIGS. 3A, 3B, 3C, 3D and 3E are plan views collectively showing the manufacturing process, after the step shown in FIG. 2C, of the semiconductor memory device according to the first embodiment of the present invention.

Then, the mask layer 14 is removed as shown in FIG. 2C, followed by introducing an impurity into that region of the substrate 11 which is positioned between the adjacent element isolating regions 16 so as to form a diffusion region (not shown). It should be noted that each of FIGS. 3A and 4A shows the step equal to the step shown in FIG. 2C and includes a selecting transistor as well as the transistors included in the memory cell section and the peripheral circuit section.

Figure 3B:
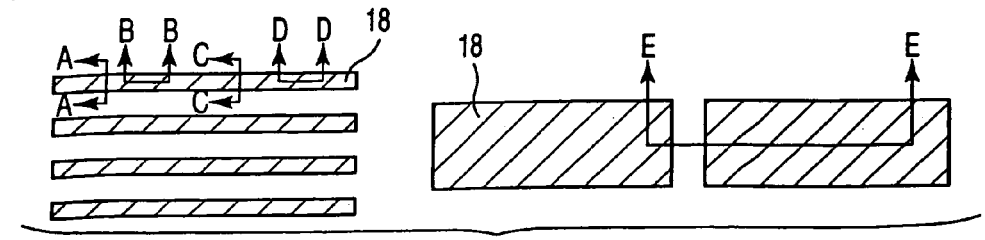

In the next step, the second conductive layer 18 consisting of, for example, polysilicon is formed on the first conductive layer 13 and the element isolating region 16, as shown in FIGS. 3B and 4B. Then, the second conductive layer 18 is selectively removed by a CMP method or a CDE (Chemical Dry Etching) method with the element isolating region 16 used as a stopper, with the result that at least the surface of the element isolating region 16 is exposed to the outside. In other words, the surface of the second conductive layer 18 is rendered flush with or lower than the surface of the element isolating region 16.

Figure 3C:
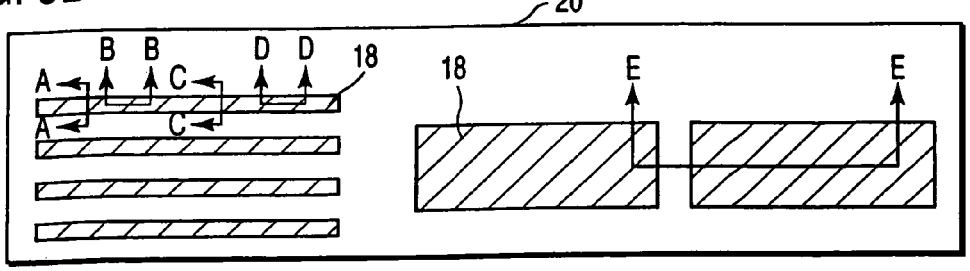

Then, an etching back is applied to a part of the element isolating region 16 included in the memory cell section, as shown in FIGS. 3C and 4C (see the cross sectional view along the line A-A). A control gate CG is formed later in the etched back portion. Further, the second insulating film 20 consisting of, for example, ONO (Oxide Nitride Oxide) film is formed on the element isolating region 16 and the second conductive layer 18.

Figure 3D:
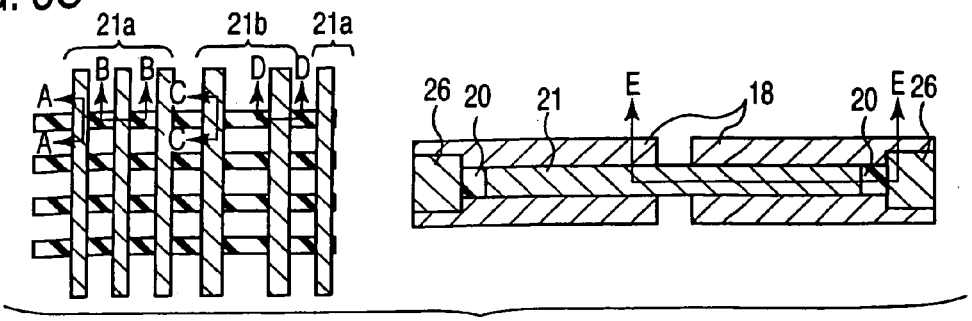

In the next step, the third conductive layer 21 is formed on the second insulating film 20, followed by forming a patterned resist film (not shown) on the third conductive layer 21, as shown in FIGS. 3D and 4D. Then, the third conductive film 21 is selectively etched with the resist film used as a mask so as to form a word line 7a and a select line 7b of the selecting transistor, each of the word line 71 and the select line being formed of the third conductive layer 21. The third conductive layer is electrically insulated from the first and second conductive layers 13, 18 by the second insulating film 20 and performs the function of the control gate CG.

Then, a part of the second insulating film 20 included in the peripheral circuit section is peeled off so as to expose a part of the surface of the second conductive layer 18 to the outside, followed by forming the fourth conductive layer 26 on the exposed surface of the second conductive layer 18. As a result, the fourth conductive layer is electrically connected to the first and second conductive layers 13 and 18. It should be noted that the fourth conductive layer 26 forms the contact portions of the gate electrodes G1 and G2.

Figure 3E:
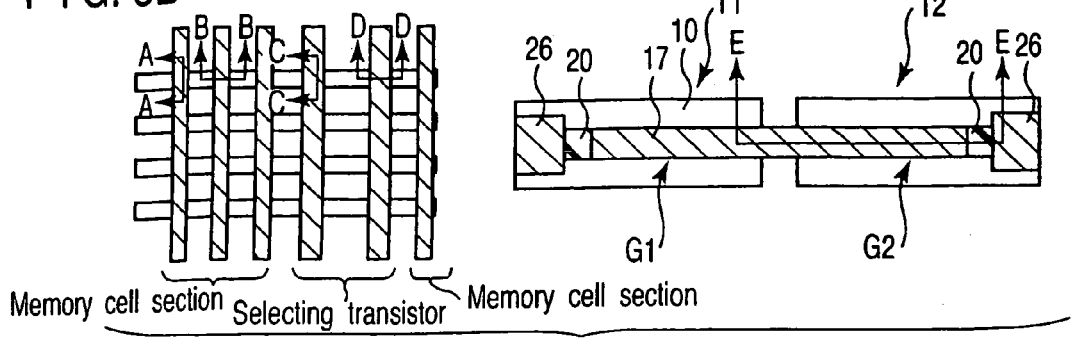

In the next step, the first and second conductive layers 13 and 18 are simultaneously etched with the third conductive layer 21 (word line 7a, select line 7b) and the second insulating film 20 used as a mask, as shown in FIGS. 3E and 4E (see the cross sectional views along the lines B-B and D-D). As a result, formed in the memory cell section are the floating gate FG consisting of the first and second conductive layers 13, 18, the gate of the selecting transistor, and the gate of the peripheral circuit section. Then, an impurity is introduced into the substrate 11 with these gates used as a mask so as to form a diffusion region (not shown).

Finally, the third insulating film 22 is formed on the entire substrate, followed by forming a contact hole exposing the surface of the fourth conductive layer 26 and subsequently filling the contact hole with a conductive layer so as to form the contact 23 connected to the exposed surface of the fourth conductive layer 26, as shown in FIG. 1B. As described above, the memory cell section and the peripheral circuit section are formed simultaneously.

According to the first embodiment, in simultaneously forming the memory cell section and the peripheral circuit section, the gate electrodes G1, G2 of the transistors T1, T2 included in the peripheral circuit section are formed by self-alignment with the element isolating region 16. Also, the adjacent gate electrodes G1, G2 are electrically insulated from each other by the element isolating region 16 and the second insulating film 20. It follows that it is unnecessary to provide fringes, which are required in the prior art, for preventing the adjacent gate electrodes G1 and G2 from being brought into mutual contact, making it possible to decrease the distance between the adjacent transistors formed in the peripheral circuit section. In other words, the distance between the adjacent gate electrodes G1 and G2 in the peripheral circuit section can be made equal to the width of the element isolating region 16. Thereby miniaturizing the peripheral circuit section. It follows that the memory cell section and the peripheral circuit section can be formed simultaneously while miniaturizing the chip.

The laminate structure of the first and second conductive layers 13 and 18 is separated by the element isolating region 16, and the third conductive layer 21 is separated from the first and second conductive layers 13, 18 by the second insulating film 20. Therefore, even if the third conductive layer 21 is formed on the first and second conductive layers 13, 18 in the peripheral circuit section included in the semiconductor memory device in which the memory cell section and the peripheral circuit section are formed simultaneously, the operation of the peripheral circuit section is not affected by the third conductive layer 21.

Incidentally, in the step shown in FIG. 4B, it suffices for at least the surface of the element isolating region 16 to be exposed to the outside. In other words, it is possible for the surface of the second conductive layer 18 to be flush with or lower than the surface of the element isolating region 16.

Also, in the step shown in FIG. 4D, the second insulating film 20 in the peripheral circuit section was partly removed in advance, followed by forming the fourth conductive layer 26 (see the cross sectional view along the line E-E). However, the present invention is not limited to the particular procedure. For example, it is also possible to deposit the third conductive layer 21 after peeling of the second insulating film 20, followed by selectively etching the third conductive layer 21 so as to form a clearance, thereby forming the electrically separated fourth conductive layer 26 consisting of the third conductive layer 21.

Also, in the first embodiment, the technical idea of the present invention is applied to a NAND type EEPROM. However, the present invention is not limited to the NAND type EEPROM. For example, it is also possible to apply the technical idea of the present invention to DRAM, SRAM and a memory of NOR type or AND type except the NAND type EEPROM.

Second Embodiment

The second embodiment is a modification of the first embodiment described above and is featured in the construction of the contact portion of the gate electrode. The second embodiment will now be described in respect of only the portion differing from the first embodiment.

Figure 5A:
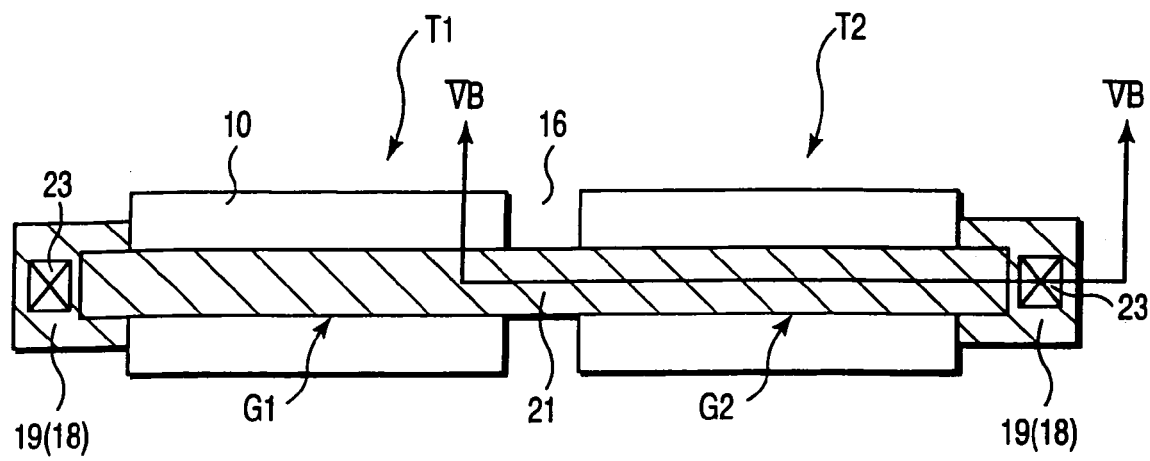
FIG. 5A is a plan view showing a transistor of the peripheral circuit section according to a second embodiment of the present invention.
Figure 5B:
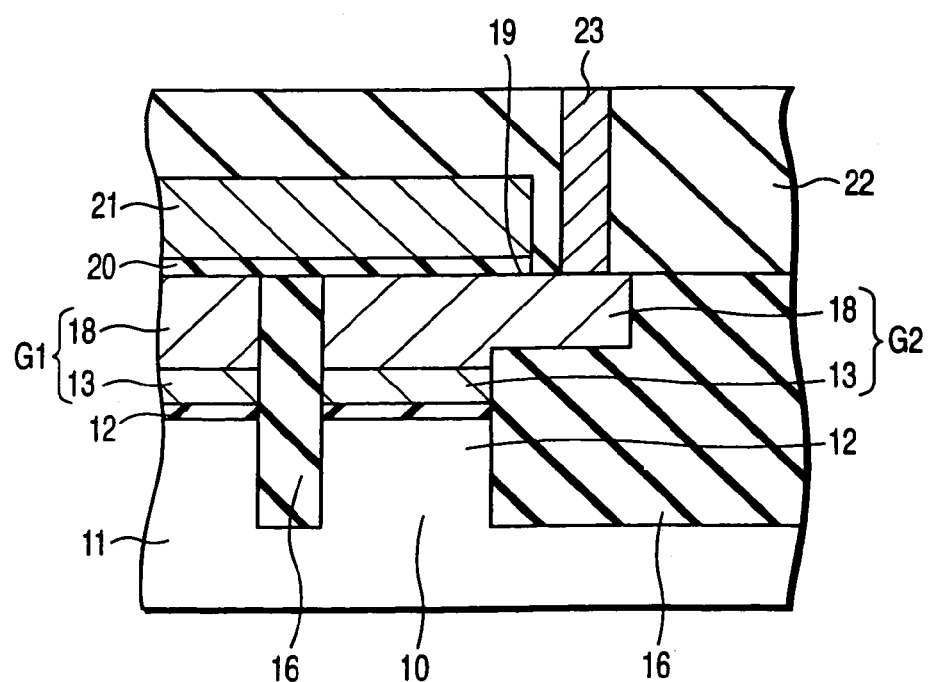
FIG. 5B is a cross sectional view of the transistor along the line VB-VB shown in FIG. 5A.

FIG. 5A is a plan view showing a transistor of the peripheral circuit section included in the semiconductor memory device according to the second embodiment of the present invention, and FIG. 5B is a cross sectional view showing the transistor along the line VB-VB shown in FIG. 5A.

As shown in FIGS. 5A and 5B, the second conductive layer 18 formed on the first conductive layer 13 extends into the element isolating region 16. In other words, the second conductive layer 18 includes a section positioned within the element isolating region 16. The particular section is called herein an extending section 19. The surface of the extending section 19 is exposed to the outside, and the third conductive layer 21 is formed on the second conductive layer 18 with the second insulating film 20 interposed therebetween. Also, the contact 23 is connected to the exposed surface of the extending section 19.

According to the second embodiment, it is unnecessary to provide the gates G1 and G2 with fringes as in the first embodiment, making it possible to shorten the distance between the adjacent gates of the transistors included in the peripheral circuit section. It follows that it is possible to form simultaneously the memory cell section and the peripheral circuit section while diminishing the chip area.

Further, a groove 17 is formed in the element isolating region 16 of the peripheral circuit section, and the second conductive layer 18 is allowed to extend into the groove 17. In the second embodiment, the contact portions of the gate electrodes G1 and G2 are formed by exposing the second conductive layer 18 of the extending section 19. It follows that the contact portions of the gate electrodes G1 and G2 can be formed easily, compared with the first embodiment.

It is possible to expose the second conductive layer 18 of the extending section 19 simultaneously with formation of the control gate in the memory section. It follows that, even if the contact portions of the gate electrodes G1, G2 are formed as in the second embodiment, the number of manufacturing steps is not increased.

Third Embodiment

The third embodiment is directed to the manufacturing method of the construction of the second embodiment and takes up as an example a semiconductor memory device used as, for example, a flash memory.

Figure 6A:
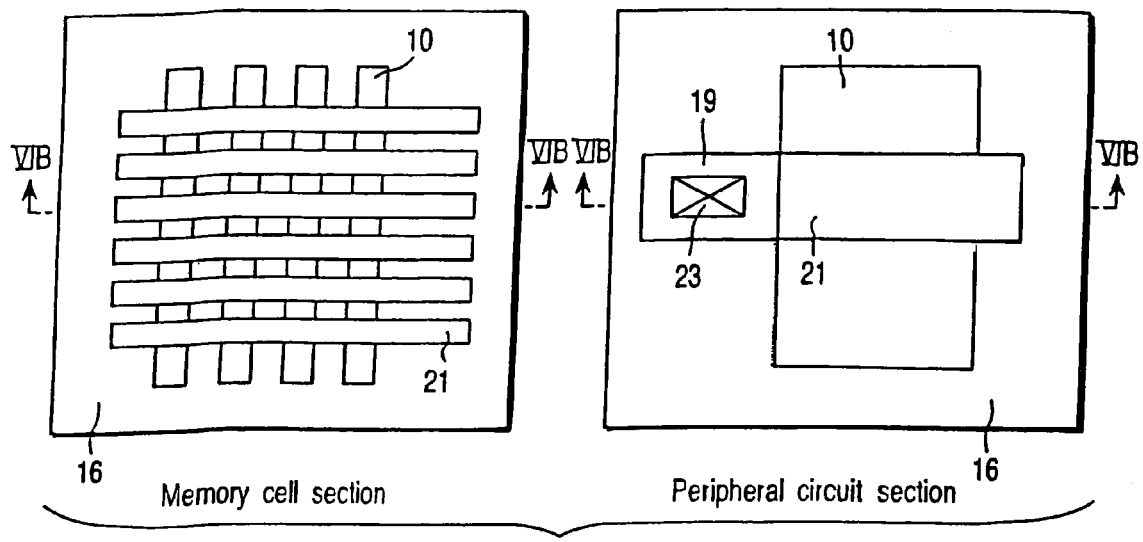
FIG. 6A is a plan view showing the memory cell section and the peripheral circuit section of the semiconductor memory device according to a third embodiment of the present invention.
Figure 6B:
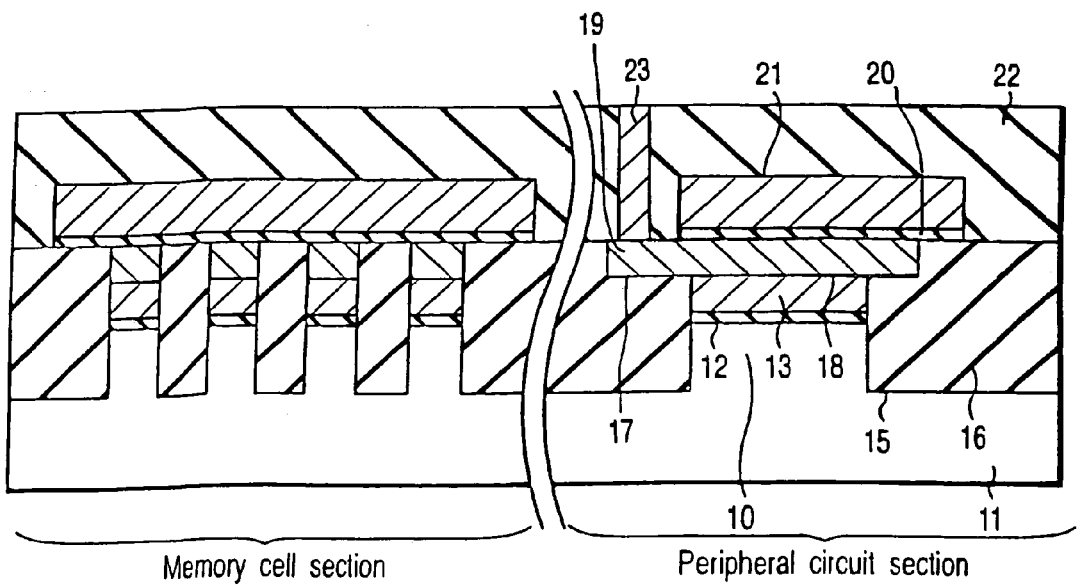
FIG. 6B is a cross sectional view of the semiconductor memory device along the line VIB-VIB shown in FIG. 6A.

FIG. 6A is a plan view showing the memory cell section and the peripheral circuit section included in the semiconductor memory device according to the third embodiment of the present invention, and FIG. 6B is a cross sectional view the semiconductor device along the line VIB-VIB shown in FIG. 6A.

As shown in FIGS. 6A and 6B, the construction applied to the adjacent transistors in the peripheral circuit section is applied in the third embodiment to the transistors of the peripheral circuit section and the memory cell as in the second embodiment. In other words, in the third embodiment, it is possible for the third conductive layer 21 not to be formed to extend over the adjacent transistors of the peripheral circuit.

To be more specific, as shown in FIG. 6B, the element isolating region 16 for separating the element region 10 of the semiconductor layer 11 is formed in the peripheral circuit section of the semiconductor memory device, and the first conductive layer 13 is formed within the element region 10 with the first insulating film 12 interposed therebetween. The second conductive layer 18 is formed on the first conductive layer 13 in a manner to extend into the element isolating region 16. That region of the second conductive layer 18 which is positioned in the element isolating region 16 is called herein the extending region 19. The surface of the second conductive layer 18 is flush with or lower than the surface of the element isolating region 16. Also, the surface of the extending region 19 is exposed to the outside, and the third conductive layer 21 is formed on the second conductive layer 18 with the second insulating film 20 interposed therebetween. Further, the contact 23 is connected to the extending region 19 of the second conductive layer 18.

In the memory cell section of the semiconductor memory device, the first conductive layer 13 is formed within the element region 10 with the first insulating film 12 interposed therebetween, and the second conductive layer 18 is formed on the first conductive layer 13. The surface of the second conductive layer 18 is flush with or lower than the surface of the element isolating region 16. Also, the third conductive layer 21 is formed on the second conductive layer 18 and the element isolating region 16 with the second insulating film 20 interposed therebetween.

In the peripheral circuit section, the laminate structure consisting of the first and second conductive layers 13 and 18 performs the function of the gate of the transistor and the function of a resistor element. On the other hand, in the memory cell section, the laminate structure of the first and second conductive layers 13 and 18 performs the function of a floating gate (charge accumulating layer), and the third conductive layer 21 performs the function of the control gate.

FIGS. 7 to 11 are cross sectional views collectively showing the manufacturing process of the semiconductor memory device according to the third embodiment of the present invention. How to form the memory cell section and the peripheral circuit section of the semiconductor memory device according to the third embodiment of the present invention will now be described with reference to FIGS. 7 to 11.

In the first step, the first conductive layer 13 is formed on a semiconductor layer 11 consisting of, for example, a conductive silicon substrate or a conductive well, with a tunnel oxide film (first insulating film) 12 thin enough to permit the flow of the tunnel current interposed therebetween, followed by forming a mask layer 14 on the first conductive layer 13, as shown in FIG. 7. Then, the mask layer 14, the first conductive layer 13, the first insulating film 12 and the semiconductor layer 11 are selectively removed so as to form the element isolating groove 15, followed by oxidizing the side wall surfaces of the element isolating groove 15 and the first conductive layer 13.

In the next step, an insulating film for the element isolation, e.g., silicon dioxide film, is deposited on the mask layer 14 and the element isolating groove 15, followed by planarizing the insulating film for the element isolation by the etch back by means of dry etching or by the surface polish by means of CMP until the surface of the mask layer 14 is exposed to the outside so as to form the element isolating region 16, as shown in FIG. 8. Then, the mask layer 14 is peeled off so as to expose the surface of the first conductive layer 13 to the outside.

In the next step, a resist film (not shown) is formed on the element isolating region 16 and, then, patterned, as shown in FIG. 9. The element isolating region 16 in contact with the element region 10 is partly removed by the wet etching or dry etching with the patterned resist film used as a mask so as to form the groove 17 in the element isolating region 16. It is necessary for the bottom surface of the groove 17 to be positioned above the surface of the first insulating film 12, and it is desirable for the bottom surface of the groove 17 to be flush with the surface of the first conductive layer 13.

Figure 10:
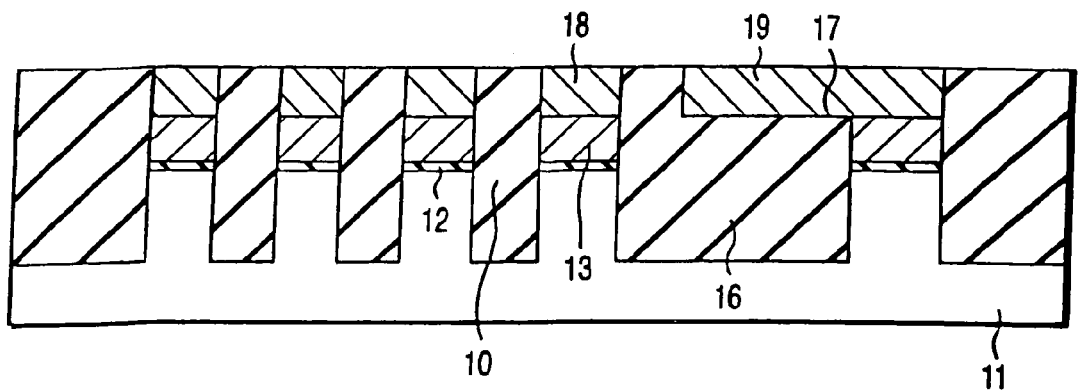

In the next step, the second conductive layer 18 is deposited on the first conductive layer 13 and the element isolating region 116, as shown in FIG. 10. Then, the second conductive layer 18 is planarized by etch back by means of a dry etching or by the surface polish by means of CMP until the surface of the element isolating region 16 is exposed to the outside so as to separate the second conductive layer 18. As a result, the extending region 19 of the second conductive layer 18 is formed in the groove 17.

Figure 11:
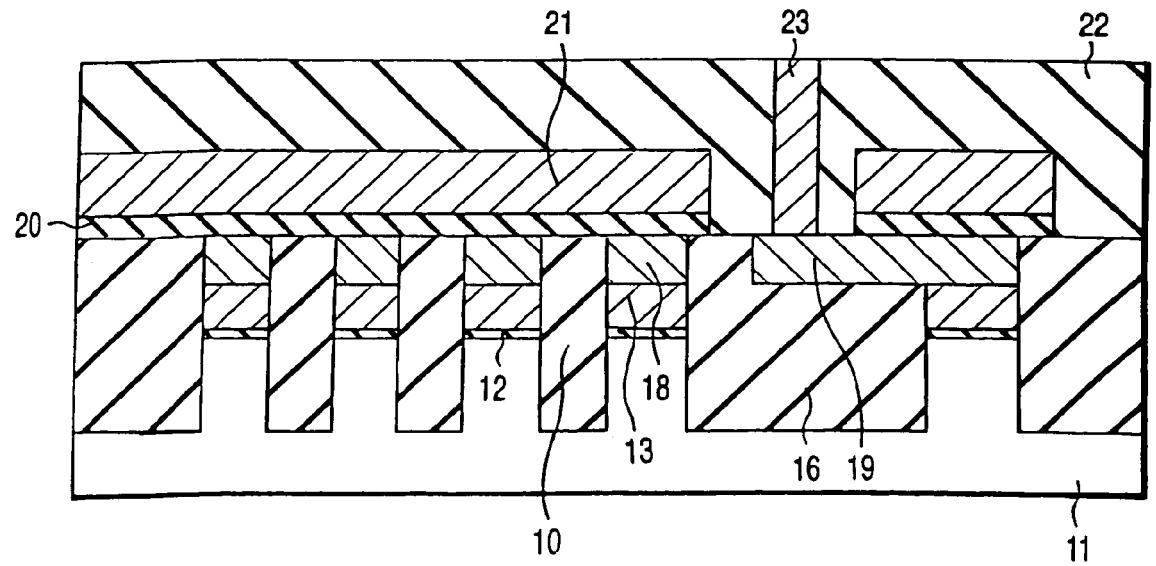

After formation of the extending region 19 of the second conductive layer 18, the second insulating film 20 is formed on the second conductive layer 18 and the element isolating region 16, followed by forming the third conductive layer 21 on the second insulating film 20, as shown in FIG. 11. Then, a resist film (not shown) is formed on the third conductive layer 21, followed by patterning the resist film. Further, the third conductive film 21 and the second insulating film 20 are selectively removed with the patterned resist film used as a mask so as to perform the gate processing. As a result, the surface of the extending region 19 of the second conductive layer 18 is partly exposed to the outside. Still further, the third insulating film 22 is formed on the entire substrate, followed by forming a contact hole exposing the surface of the extending region 19 of the second conductive film 22 to the outside. The contact hole thus formed is filled with a conductive layer so as to form the contact 23 connected to the extending region 19 on the element isolating region 16.

According to the third embodiment described above, the gate regions of the memory cell section and the peripheral circuit section are of the same laminate structure. Specifically, the gate region in each of the memory cell section and the peripheral circuit section includes the first and second conductive layers 13, 18, the second insulating film 20 formed on the second conductive layer 18, and the third conductive layer 21 formed on the second insulating film 20. It follows that the gate regions of the memory cell section and the peripheral circuit section can be formed simultaneously.

It should also be noted that the gate of the transistor in the peripheral circuit section is formed of the second conductive layer 18 forming a part of the charge accumulating layer, and the second conductive layer 18 extends from the element region 10 into the element isolating region 16 to form the extending region 19. Also, the contact 23 is connected to the extending region 19 of the second conductive layer 18. What should be noted is that, since the contact hole is positioned above the element isolating region 16, it is possible to avoid the problem that a damage is done to the element region 10 by the etching in forming the contact hole.

In the third embodiment described above, it is possible to omit formation of the second insulating film 20 in the peripheral circuit section. However, it is desirable to form the second insulating film 20 in order to form simultaneously both the memory cell section and the peripheral circuit section.

Fourth Embodiment

The fourth embodiment is directed to the semiconductor memory device, particularly, to the transistor used in the memory cell such as DRAM and SRAM and to the transistor used in various logic circuits.

FIG. 12 is a cross sectional view showing the memory cell section and the peripheral circuit section included in the semiconductor memory device according to the fourth embodiment of the present invention.

As shown in FIG. 12, the element isolating region 16 for separating the element region 10 of the semiconductor substrate 11 is formed in the peripheral circuit section included in the semiconductor memory device, and the first conductive layer 13 is formed in the element region 10 with the insulating film 12 interposed therebetween. The second conductive layer 18 is formed on the first conductive layer 13 in a manner to extend into the element isolating region 16. That portion of the second conductive layer 18 which extends into the element isolating region 16 is called herein the extending region 19 of the second conductive layer 18. It should be noted that the surface of the second conductive layer 18 is flush with or lower than the surface of the element isolating region 16. The surface of the extending region 19 of the second conductive layer 18 is exposed to the outside. The third conductive layer 21 is formed on the second conductive layer 18. Further, the contact 23 is connected to the extending region 19 of the second conductive layer 18.

The first conductive layer 13 is formed in the element region 10 with the insulating film 12 interposed therebetween in the memory cell section of the semiconductor memory device, and the second conductive layer 18 is formed on the first conductive layer 13. The surface of the second conductive layer is flush with or lower than the surface of the element isolating region 16. Also, the third conductive layer 21 is formed on the second conductive layer 18 and the element isolating region 16.

In the peripheral circuit section, the laminate structure consisting of the first and second conductive layers 13 and 18 performs the function of the gate of the transistor and also performs the function of a resistance element. On the other hand, in the memory cell section, the laminate structure of the first and second conductive layers 13 and 18 performs the function of a floating gate (charge accumulating layer), and the third conductive layer 21 performs the function of a control gate.

In the fourth embodiment described above, it is possible for the first conductive layer 13 and the second conductive layer 18 to be formed of the same material or different materials. Where different materials are used, it is possible for the first conductive layer 13 to be formed of, for example, a conductive polysilicon. On the other hand, it is possible for each of the second and third conductive layers 18, 23, which is generally formed of a conductive polysilicon, to be formed of, for example, a metal silicide such as tungsten silicide (WSi).

According to the fourth embodiment described above, it is possible to obtain the effect similar to that obtained by the third embodiment. To reiterate, it is possible to avoid the damage done to the element region 10 by the formation of the contact 23. It is also possible to form simultaneously the gate structures for the memory cell section and the peripheral circuit section.

Incidentally, in the fourth embodiment, it is possible to have a resistance element 25 consisting of the second conductive layer 18 formed within the element isolating region 16. In this case, it is possible to obtain additional effects that the degree of freedom in setting the resistance value is higher than that in the case of using a resistance element formed of a diffusion layer, and that it is possible to avoid the nonuniformity of the resistance value caused by the temperature characteristics, in addition to the effects obtained by the fourth embodiment described above.

Fifth Embodiment

The fifth embodiment is directed to a modification of the manufacturing method described previously in conjunction with the third embodiment and is featured in the method of burying a conductive layer after formation of a groove for forming the extending region of the conductive layer. It should also be noted that the charge accumulating layer is of a single layer structure in the fifth embodiment.

Figure 14:
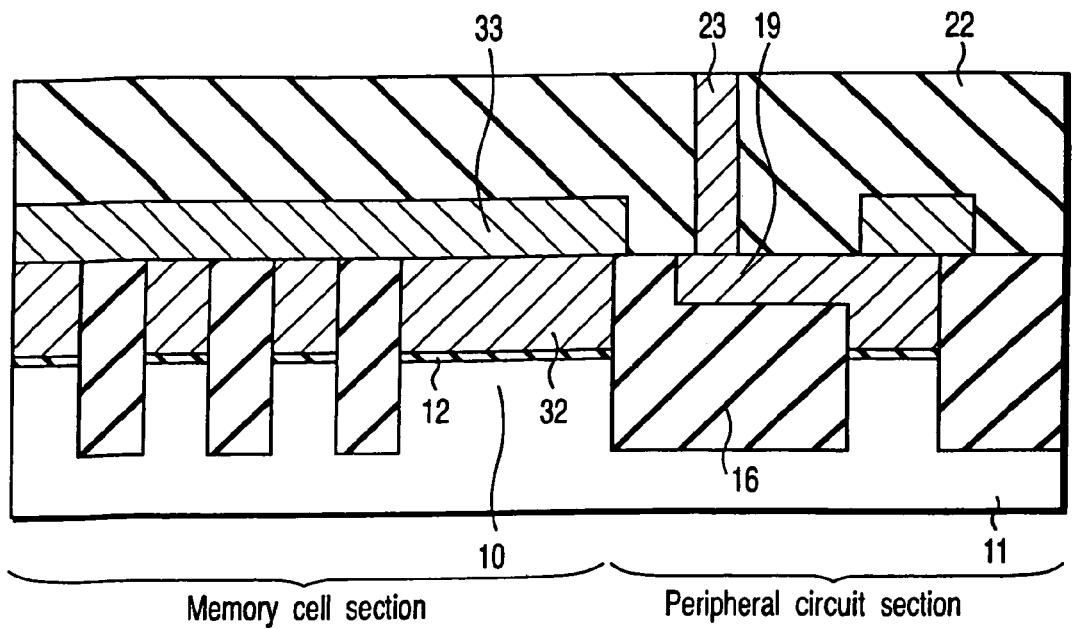
FIG. 14 is a cross sectional view showing the memory cell section and the peripheral circuit section of a semiconductor memory device according to a fifth embodiment of the present invention.

FIG. 14 is a cross sectional view showing the memory cell section and the peripheral circuit section of the semiconductor memory device according to the fifth embodiment of the present invention.

As shown in FIG. 14, the element isolating region 16 for separating the element region 10 of the semiconductor layer 11 is formed in the peripheral circuit section of the semiconductor memory device, and the first insulating film 12 is formed in the element region 10. A first conductive layer 32 is formed on the first insulating film 12 in a manner to extend into the element isolating region 16. That portion of the first conductive layer 31 which extends into the element isolating region 16 is called herein the extending region 19 of the first conductive layer 32. It should be noted that the surface of the first conductive layer 32 is flush with or lower than the surface of the element isolating region 16. The surface of the extending region 19 is exposed to the outside. Also, a second conductive layer 33 is formed on the first conductive layer 32. Further, the contact 23 is connected to the extending region 19 of the first conductive layer 32.

In the memory cell section of the semiconductor memory device, the first conductive layer 32 is formed in the element region 10 with the insulating film 12 interposed therebetween. The surface of the first conductive layer 32 is flush with or lower than the surface of the element isolating region 16. Also, the second conductive layer 33 is formed on the first conductive layer 32 and the element isolating region 16.

It should be noted that the first conductive layer 32 in the peripheral circuit section performs the function of the gate of the transistor and also performs the function of a resistance element. On the other hand, in the memory cell section, the first conductive layer 32 performs the function of a floating gate (charge accumulating layer), and the second conductive layer 33 performs the function of a control gate.

FIGS. 15 to 19 are cross sectional views collectively showing the manufacturing process of the semiconductor memory device according to the fifth embodiment of the present invention. How to form the memory cell section and the peripheral circuit section of the semiconductor memory device according to the fifth embodiment of the present invention will now be described with reference to FIGS. 15 to 19.

Figure 15:
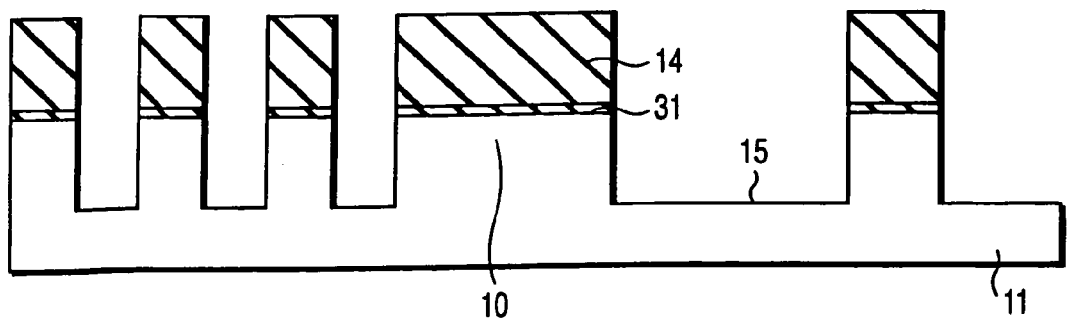
FIGS. 15, 16, 17, 18 and 19 are cross sectional views collectively showing the manufacturing process of a semiconductor memory device according to a fifth embodiment of the present invention.

In the first step, a dummy insulating film 31 is formed on the semiconductor layer 11, followed by forming the mask layer 14 on the dummy insulating film 31, as shown in FIG. 15. Then, the mask layer 14, the dummy insulating film 31 and the semiconductor layer 11 are selectively removed so as to form the element isolating groove 15.

Figure 16:
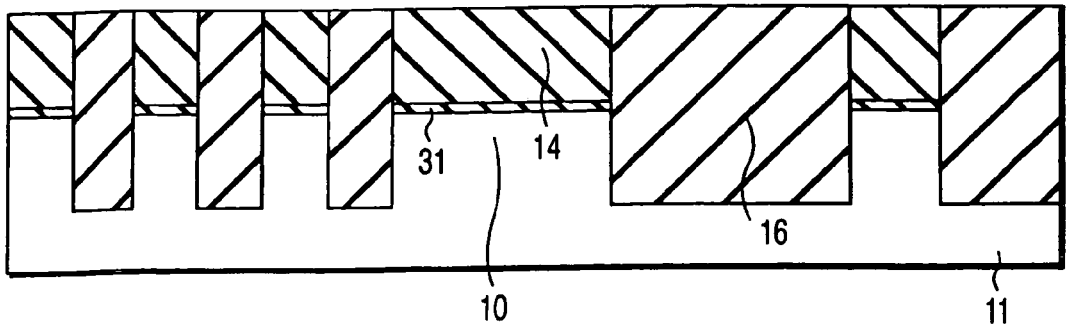

In the next step, an insulating film for the element isolation is formed on the dummy insulating film 31 and the element isolating groove 15, as shown in FIG. 16, followed by planarizing the insulating film for the element isolation by the etch back by means of a dry etching or by the surface polish by CMP until the surface of the mask layer 14 is exposed to the outside, thereby forming the element isolating region 16.

Figure 17:
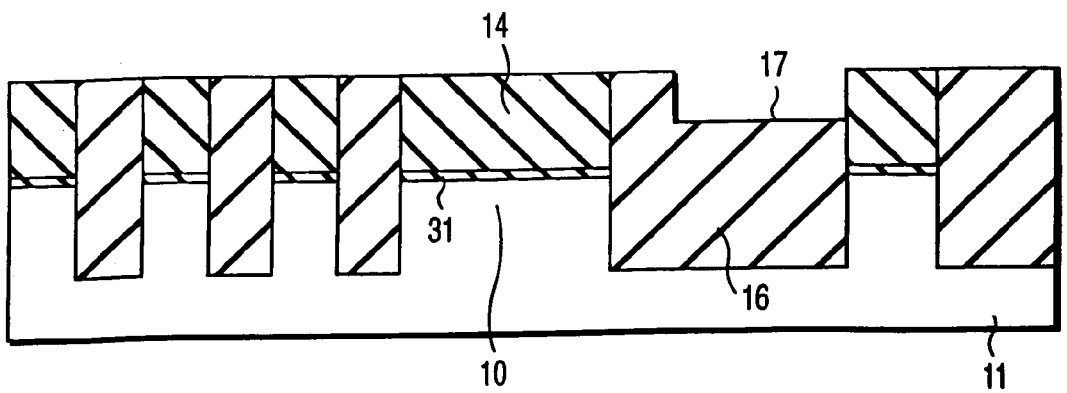

Then, a resist film (not shown) is formed on the element isolating region 16, followed by patterning the resist film, as shown in FIG. 17. Further, a part of the element isolating region 16 in contact with the element region 10 is removed by a wet etching or a dry etching with the patterned resist film used as a mask, thereby forming the groove 17 in the element isolating region 17. It should be noted that the bottom surface of the groove 17 is positioned higher than the surface of the dummy insulating film 31.

Figure 18:
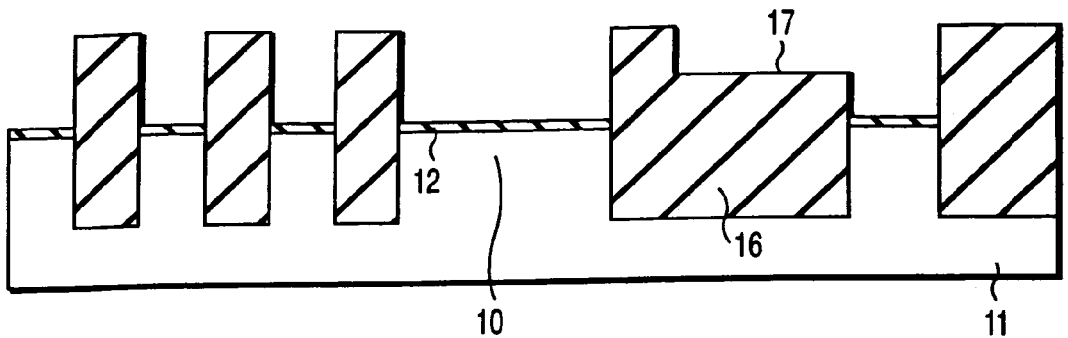

In the next step, the mask layer 14 is peeled off, followed by peeling off the dummy insulating film 31, as shown in FIG. 18. Then, the first insulating film 12 is newly formed on the semiconductor layer 11. The first insulating film 12 consists of, for example, a thermal oxide film or a CVD (Chemical Vapor Deposition) film.

Figure 19:
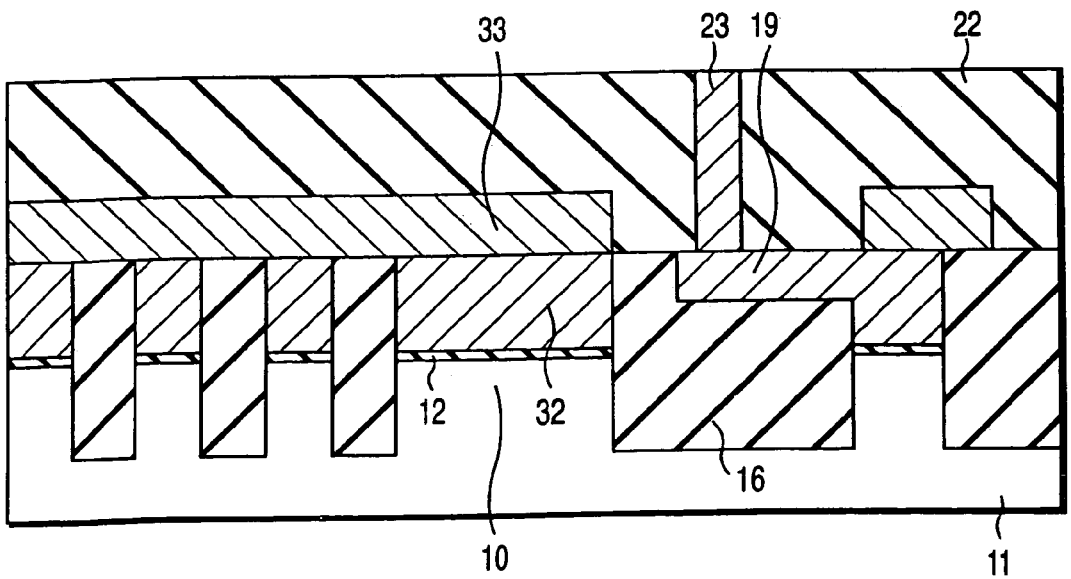

After formation of the first insulating film 12, the first conductive layer 32 is formed on the first insulating film 12 and the element isolating region 16, as shown in FIG. 19. Then, the first conductive film 32 is planarized by the etch back by means of a dry etching or by the surface polish by means of CMP until the surface of the element isolating region 16 is exposed to the outside so as to form the extending region 19 of the first conductive layer 32. Further, the second conductive layer 33 is formed on the first conductive layer 32 and the element isolating region 16, followed by forming a resist film (not shown) on the second conductive layer 33 and subsequently patterning the resist film. Still further, the second conductive film 33 is selectively removed with the patterned resist film used as a mask, thereby forming the gate structure. As a result, the surface of the extending region 19 of the first conductive layer 32 is exposed to the outside. Then, a third insulating film 22 is formed on the entire substrate, followed by forming a contact hole exposing the surface of the extending region 19 in the third insulating film 22. A conductive film is buried in the contact hole, thereby forming the contact 23 connected to the extending region 19 positioned in the element isolating region 16.

According to the fifth embodiment described above, it is possible to obtain additional effects that it is possible to avoid the damage done to the element region 10 by the formation of the contact 23, and that it is possible to form simultaneously the gate structures for the memory cell section and the peripheral circuit section, in addition to the effect produced by the third embodiment described previously.

It should also be noted that, after the element isolating groove 14 and the groove 17 for the extending region 19 are formed by using the dummy insulating film 31, the dummy insulating film 31 is removed and the first insulating film 12 is newly formed. It follows that it is possible to suppress various damages done during formation of the first insulating film 12 so as to suppress the deterioration in the performance of the first insulating film 12, thereby improving the performance of the element.

Sixth Embodiment

In the sixth embodiment, the construction of the semiconductor memory device having a floating gate structure as in the third embodiment is applied to a semiconductor memory device having a memory cell selecting transistor. In describing the sixth embodiment, the description of the construction equal to that of the third embodiment is omitted, and the differing construction alone will be described.

Figure 20A:
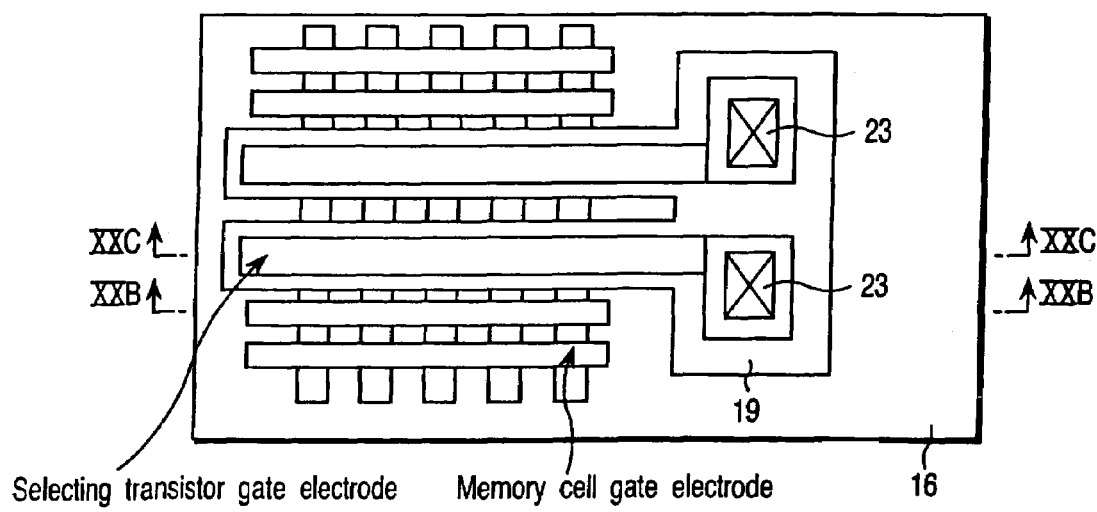
FIG. 20A is a plan view showing the memory cell section and the peripheral circuit section of a semiconductor memory device according to a sixth embodiment of the present invention.
Figure 20B:
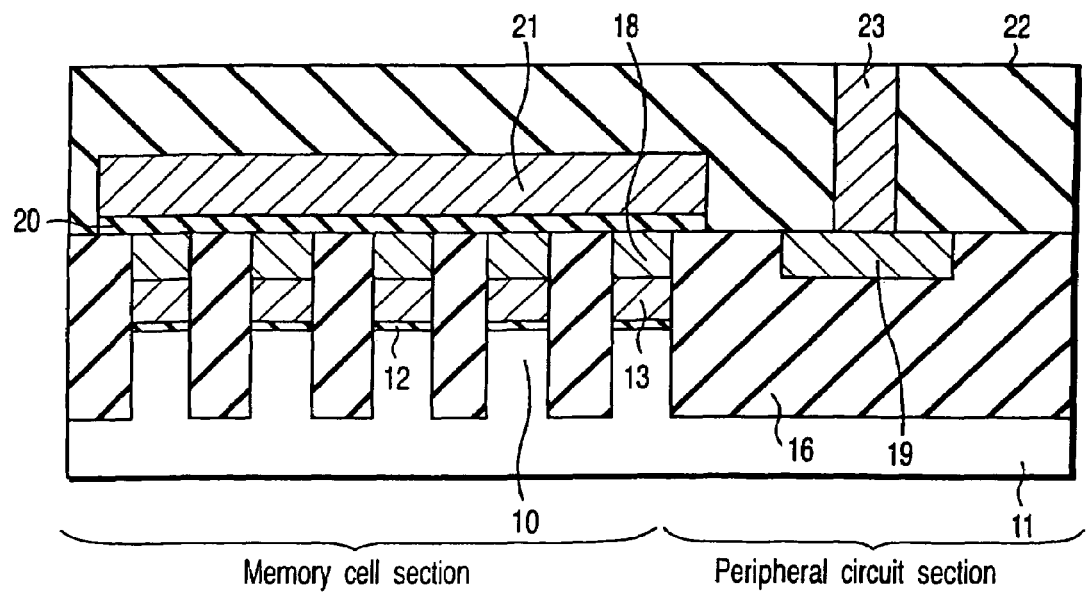
FIG. 20B is a cross sectional view showing the semiconductor memory device along the line XXB-XXB shown in FIG. 20A.
Figure 20C:
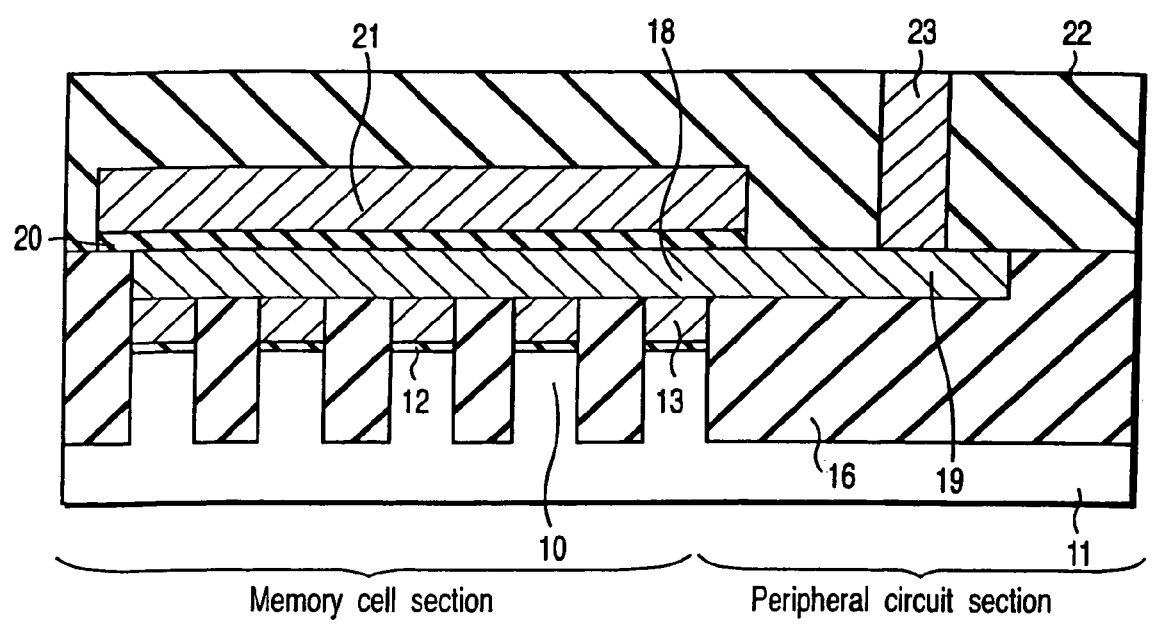
FIG. 20C is a cross sectional view showing the semiconductor memory device along the line XXC-XXC shown in FIG. 20A.
Figure 21A:
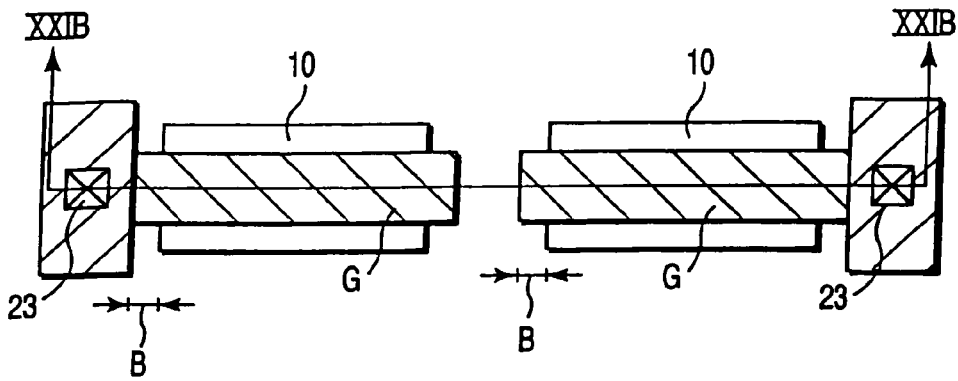
FIG. 21A is a plan view showing the transistor constituting the peripheral circuit of a conventional flash memory.
Figure 21B:
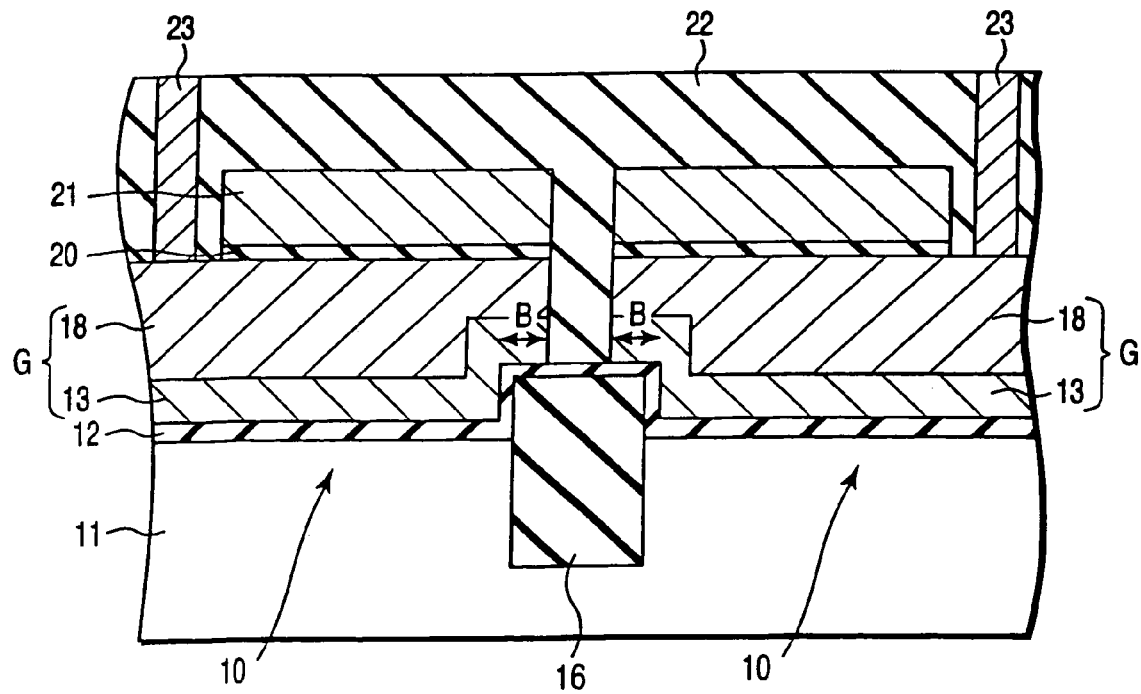
FIG. 21B is a cross sectional view showing the transistor along the line XXIB-XXIB shown in FIG. 21A.

FIG. 20A is a plan view showing the memory cell section and the peripheral circuit section of the semiconductor memory device according to the sixth embodiment of the present invention, and FIG. 20B is a cross sectional view of the semiconductor memory device along the line XXB-XXB shown in FIG. 20A, and FIG. 20C is a cross sectional view of the semiconductor memory device along the line XXC-XXC shown in FIG. 20A.

Where the gate wiring of the memory cell selecting transistor and the charge accumulating layer of the memory cell are formed of the same conductive layer in the sixth embodiment of the present invention, the charge accumulating layer of the memory cell performs the function of a floating gate. In this case, it is necessary for the charge accumulating layer forming the gate wiring of the memory cell selecting transistor to be electrically connected to an upper wiring via a contact.

Then, as shown in FIG. 20A, the gate electrode of the selecting transistor is allowed to extend to form the memory cell. As shown in FIGS. 20B and 20C, the second conductive layer 18 of the memory cell is allowed to extend to form the extending region 19 extending into the element isolating region 16 serving to separate the memory cell section and the peripheral circuit section. Also, the contact 23 is connected to the extending region 19. The gate electrode of the selecting transistor is comprised of the first and second conductive layers 13, 18. Therefore, the second conductive layer 18 is extend to the memory cell without dividing between the element isolating regions 16 and is continuous formed on the element isolating region 16 and the first conductive layer 13 of the memory cell.

According to the sixth embodiment described above, it is possible to obtain additional effects that it is possible to avoid the damage done to the element region 10 by the formation of the contact 23, and that it is possible to form simultaneously the gate structures for the memory cell section and the peripheral circuit section, in addition to the effect produced by the third embodiment described previously.

Further, since the contact 23 can be formed on the element isolating region 16, it is possible to realize a nonvolatile memory cell structure including selecting gates that can be made integral with a high density.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
   a semiconductor layer including an element region and an element isolating region for separating said element region;
   a first conductive layer formed within said element region with an insulating film interposed therebetween;
   a second conductive layer formed on said first conductive layer within said element region, said second conductive layer formed on said first conductive layer extending into said element isolating region, and said second conductive layer including a first section formed on said first conductive layer and a second section formed within said element isolating region;
   a third conductive layer formed on said second conductive layer and exposing at least one part of a surface of said second section; and
   a contact region electrically connected to an exposed surface of said second section, wherein
   a resistance element comprising said second conductive layer is formed within said element isolating region.

2. The semiconductor memory device according to claim 1, wherein said first and second conductive layers form a gate electrode of at least one element comprising a peripheral circuit arranged around the memory cell.

3. The semiconductor memory device according to claim 1, wherein a surface of said second conductive layer is equal level with or lower than a surface of said element isolating region.

4. The semiconductor memory device according to claim 1, which comprises a peripheral circuit section in which said first and second conductive layers compose a gate electrode of a peripheral circuit element, and a memory cell section in which said first and second conductive layers compose a floating gate and said third conductive layer composes a control gate,
   wherein said memory cell section includes:
   said semiconductor layer including said element region and said element isolating region for separating said element region;
   said first conductive layer formed within said element region with said first insulating film interposed therebetween;
   said second conductive layer formed on said first conductive layer within said element region; and
   said third conductive layer formed on said second conductive layer and said element isolating region.

* * * * *